(12) United States Patent
Prakash et al.

(10) Patent No.: US 8,952,742 B2
(45) Date of Patent: Feb. 10, 2015

(54) HIGHLY ACCURATE TRUE RMS POWER DETECTOR FOR CELLULAR APPLICATIONS

(71) Applicant: Marvell World Trade Ltd., St. Michael (BB)

(72) Inventors: Chandra B. Prakash, Austin, TX (US); Manas Behera, Cedar Park, TX (US); Gregory T. Uehara, Kaneohe, HI (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/067,411

(22) Filed: Oct. 30, 2013

(65) Prior Publication Data

US 2014/0118050 A1 May 1, 2014

Related U.S. Application Data

(60) Provisional application No. 61/720,523, filed on Oct. 31, 2012.

(51) Int. Cl.
*G06G 7/20* (2006.01)
*G06G 7/24* (2006.01)
*G01R 19/02* (2006.01)

(52) U.S. Cl.
CPC .................................. *G01R 19/02* (2013.01)
USPC ....................................................... 327/348

(58) Field of Classification Search
USPC ....................................................... 327/348
See application file for complete search history.

(56) References Cited

U.S. PATENT DOCUMENTS

| 3,967,105 | A | * | 6/1976 | Harrington | 708/851 |
|---|---|---|---|---|---|
| 4,327,329 | A | | 4/1982 | Papworth | |
| 5,189,362 | A | * | 2/1993 | Doble | 324/106 |
| 5,831,327 | A | * | 11/1998 | Kimura | 327/563 |
| 6,429,720 | B1 | | 8/2002 | Gilbert | |
| 7,994,840 | B2 | * | 8/2011 | Meyer | 327/348 |
| 8,358,166 | B2 | * | 1/2013 | Meyer | 327/348 |
| 8,665,126 | B2 | * | 3/2014 | Silva et al. | 341/138 |
| 8,698,544 | B2 | * | 4/2014 | Bowers et al. | 327/348 |
| 2002/0153937 | A1 | * | 10/2002 | Gilbert | 327/348 |
| 2003/0030478 | A1 | * | 2/2003 | Gilbert | 327/348 |
| 2003/0122614 | A1 | | 7/2003 | Gilbert | |
| 2004/0239398 | A1 | * | 12/2004 | Gilbert | 327/349 |
| 2005/0127986 | A1 | * | 6/2005 | Gilbert | 327/538 |
| 2007/0270116 | A1 | * | 11/2007 | Kouwenhoven | 455/296 |
| 2008/0024191 | A1 | * | 1/2008 | Zou | 327/348 |

(Continued)

OTHER PUBLICATIONS

International Search Report and Written Opinion issued Feb. 21, 2014 in PCT/US2013/067774.

(Continued)

*Primary Examiner* — Adam Houston (57) ABSTRACT

New devices and methods capable of detecting a true Root-Mean-Square (RMS) power level of an analog input signal are disclosed. For example, an electronic circuit can include a squaring circuit that receives the analog input signal and processes the analog input signal so as to produce a squared-output of the analog input signal using an analog transfer function of the squaring circuit, and a square-root circuit that receives the squared-output and processes the squared-output using an analog transfer function of the square-root circuit so as to produce an analog RMS output signal representing the true RMS power level of the analog input signal.

19 Claims, 13 Drawing Sheets

(56) References Cited

U.S. PATENT DOCUMENTS

| | | | |
|---|---|---|---|
| 2008/0129279 A1* | 6/2008 | Gallavan | 324/123 R |
| 2009/0284300 A1* | 11/2009 | Meyer | 327/348 |
| 2010/0194461 A1* | 8/2010 | Kouwenhoven | 327/348 |
| 2011/0148389 A1* | 6/2011 | Bohannon | 323/313 |
| 2011/0234205 A1* | 9/2011 | De Sousa et al. | 324/123 R |
| 2014/0118050 A1* | 5/2014 | Prakash et al. | 327/348 |

OTHER PUBLICATIONS

I.M. Filanovsky, et al., "Simple CMOS Analog Square-Rooting and Squaring Circuits" IEEE Transactions on Circuits and Systems Part 1, vol. 39, No. 4, XP000305161, Apr. 1, 1992, pp. 312-315.

Yijun Zhou, et al., "A Low-Power Ultra-Wideband CMOS True RMS Power Detector" IEEE Transactions on Microwave Theory and Techniques, vol. 56, No. 5, XP011207325, May 1, 2008, pp. 1052-1058.

* cited by examiner

HIGHLY ACCURATE TRUE RMS POWER DETECTOR FOR CELLULAR APPLICATIONS

INCORPORATION BY REFERENCE

This application claims the benefit of U.S. Provisional Application No. 61/720,523 entitled "HIGHLY ACCURATE TRUE RMS POWER DETECTOR FOR CELLULAR APPLICATIONS" filed on Oct. 31, 2012, the content of which is incorporated herein by reference in its entirety.

BACKGROUND

Power detection circuitry is useful, if not necessary, for a wide range of devices and circuitry, such as cellular phones and Ethernet receivers. Unfortunately, in order to have the necessary accuracy over a wide range of amplitudes and frequencies, such power detection circuitry can be expensive and complex. Accordingly, new design approaches for power detection circuitry may be desirable.

SUMMARY

Various aspects and embodiments of the invention are described in further detail below.

In an embodiment, an electronic circuit capable of detecting a true Root-Mean-Square (RMS) power of an analog input signal is disclosed. The electronic circuit includes a squaring circuit that receives the analog input signal and processes the analog input signal so as to produce a squared-output of the analog input signal using an analog transfer function of the squaring circuit, and a square-root circuit that receives the squared-output and processes the squared-output using an analog transfer function of the square-root circuit so as to produce an analog RMS output signal representing the true RMS power level of the analog input signal.

In another embodiment, an electronic circuit capable of detecting a true Root-Mean-Square (RMS) power of an analog input signal is disclosed. The electronic circuit includes a squaring circuit that receives the analog input signal and processes the analog input signal so as to produce a squared-output of the analog input signal using an analog transfer function of the squaring circuit, wherein the squaring circuit includes one or more Metal Oxide Semiconductor (MOS) field-effect transistors operable in an analog range, and a square-root circuit that receives the squared-output and processes the squared-output using an analog transfer function of the square-root circuit so as to produce an analog RMS output signal representing the true RMS power level of the analog input signal. The squaring circuit includes one or more Metal Oxide Semiconductor (MOS) field-effect transistors operable in an analog range, and a programmable analog Low Pass Filter (LPF) configurable so as to provide a plurality of different filters having appreciably different bandwidths and capable of appreciably affecting accuracy of the output signal for a Peak-to-Average Ratio (PAR) of the input signal, wherein both the squaring circuit and the square-root circuit perform their respective functions using only analog circuitry.

In yet another embodiment, a method for detecting a true Root-Mean-Square (RMS) power from an input signal is disclosed. The method includes producing a square the analog input signal so as to produce a squared-output of the analog input signal by applying an analog transfer function of an analog squaring circuit, and producing a square-root circuit of the squared-output by applying an analog transfer function of an analog square-root circuit so as to produce an analog RMS output signal representing a true RMS power level of the analog input signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

The disclosed methods and systems below may be described generally, as well as in terms of specific examples and/or specific embodiments. For instances where references are made to detailed examples and/or embodiments, it is noted that the underlying principles described are not to be limited to a single embodiment, but may be expanded for use with any of the other methods and systems described herein as will be understood by one of ordinary skill in the art unless otherwise stated specifically.

Figure 1:
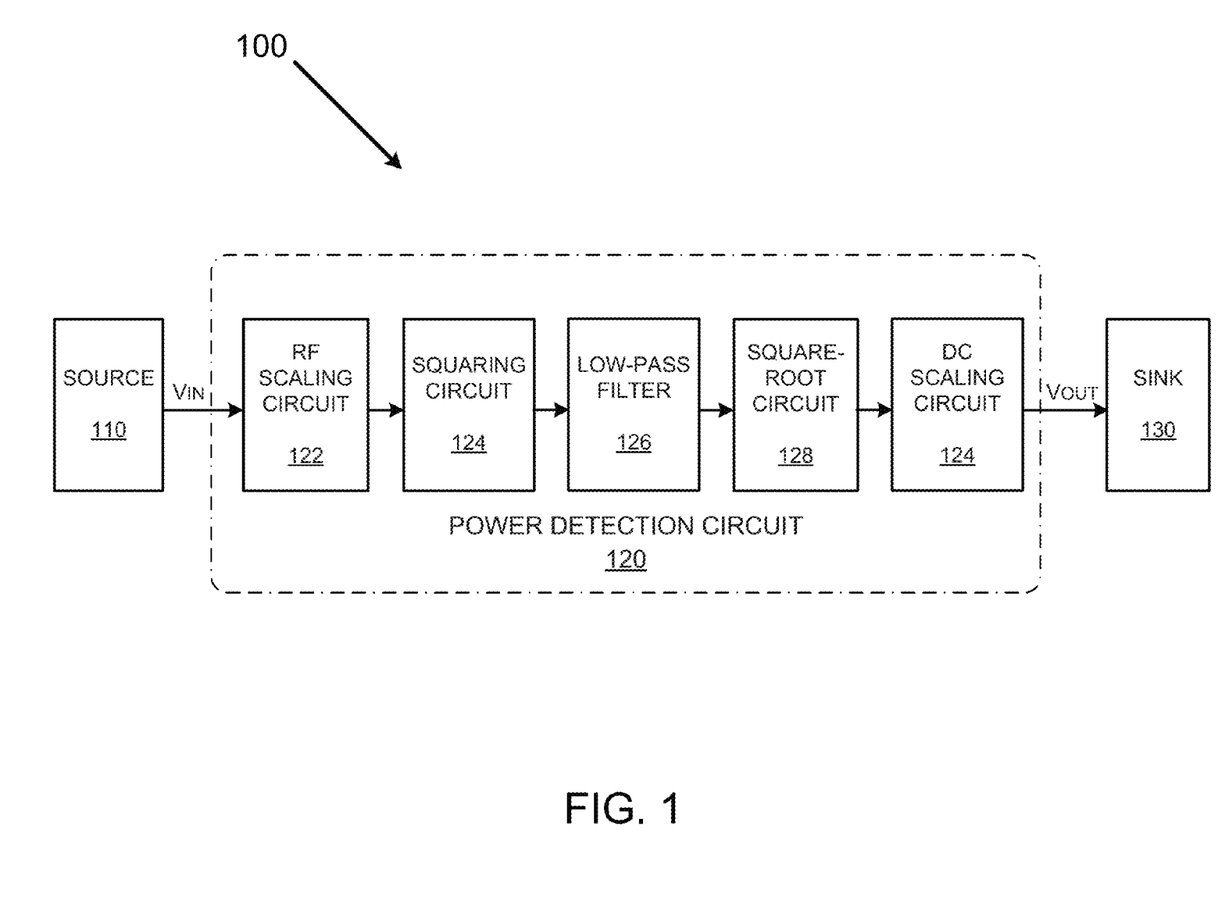
FIG. 1 is a generalized block diagram of a power detection circuit capable of providing an accurate Root-Mean-Squared output.

FIG. 1 is a generalized block diagram of a system 100 capable of providing an accurate RMS output. The system 100 has a data source 110, a power detection circuit 120 and a data sink 130. The power detection circuit 120 includes an RF scaling circuit 122, a squaring circuit 124, a low-pass filter 126, a square-root circuit 128 and a DC scaling circuit 128.

The example data source 110 is a buffered antenna feed of a cellular telephone. However, in other embodiments the data source 110 can take any number of forms depending on the need for power detection circuitry.

The example data sink 130 is an Analog-to-Digital Converter (ADC) coupled to a processor of a cellular telephone. However, as with the data source 110, the data sink 130 can also take any number of forms depending on the need for power detection circuitry.

The example power detection circuitry 120 is embedded within an integrated circuit of a cellular telephone, and may consist (with the exception of peripheral calibration circuitry) entirely of analog circuitry. As with the example source 110 and sink 130, however, the form and location of the power detection circuitry 120 can vary from embodiment to embodiment. The power detection circuitry 120 is capable of detecting a true Root-Mean-Square (RMS) of an analog signal provided by the source 110. A "true RMS" value is a value that is proportional to the square-root of the average of an instantaneously square of a signal, and not to be confused with the average of the absolute value of the signal.

In operation, an analog input signal $V_{IN}$ is provided from the source 110 to the RF scaling circuit 122, which optionally attenuates the analog input signal $V_{IN}$ before passing the analog input signal to the squaring circuit 124. The squaring circuit 124 then applies a square function to the analog input signal $V_{IN}$ to produce an output current $I_{O2}=V_{IN}^2$. The squaring circuit 124 may also apply a Low Pass Filter (LPF) (component 126) in order to compensate for errors that may occur when there is a large Peak-to-Average-Ratio (PAR) of the analog input signal $V_{IN}$. The square-root circuit 126 then applies a square-root function to current $I_{O2}$ so as to provide an analog output voltage $V_{OUT}$ to the sink 130 (after optional scaling with DC scaling circuit 128) that is a highly-accurate rendition of a true RMS value of the analog input signal $V_{IN}$.

Figure 2A:
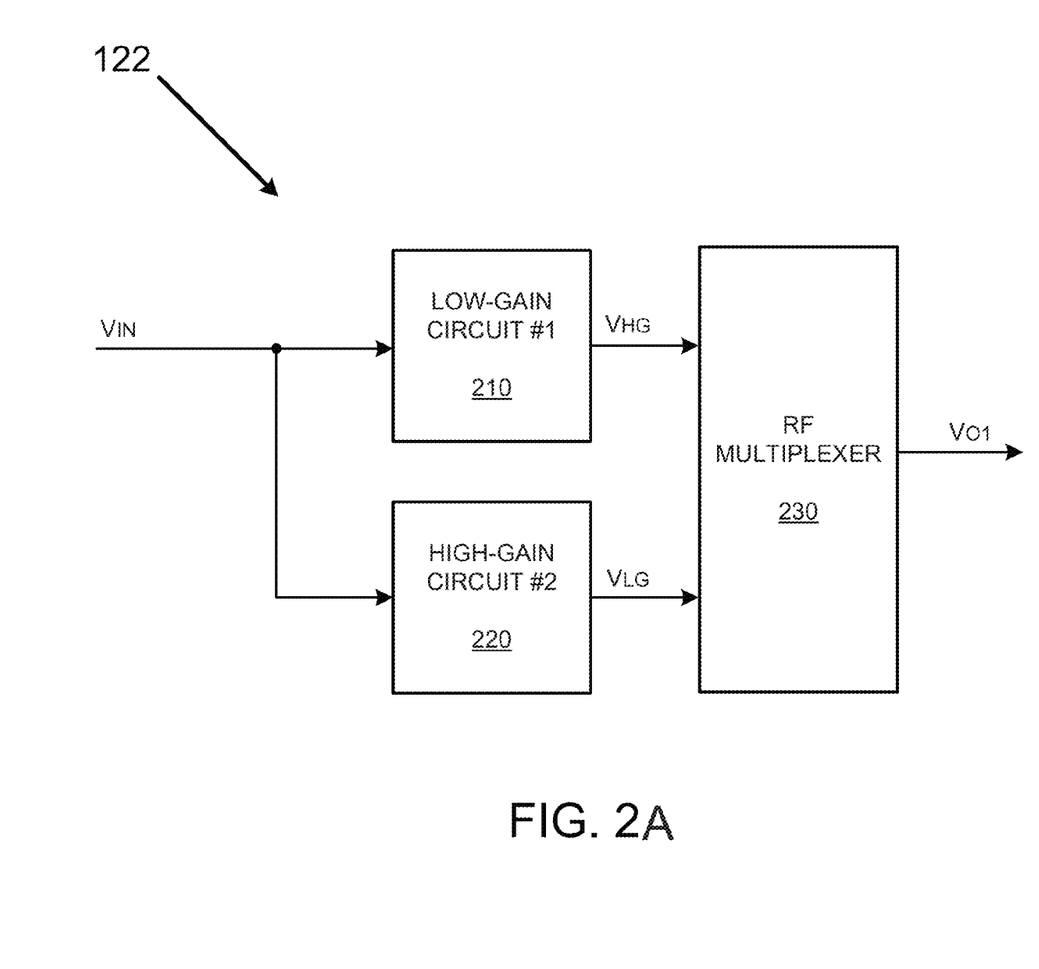
FIG. 2A is general block diagram of a scaling circuit usable for the detection circuit of FIG. 1.

FIG. 2A is general block diagram of an RF scaling circuit 122 usable for the detection circuit of FIG. 1. The scaling circuit 122 includes a low-gain (high-level input) circuit 210 that produces signal $V_{HG}$, a high-gain (low-level input) circuit 220 that produces signal $V_{LG}$, and a multiplexer 230. While the example of FIG. 2 includes only two different gain circuits 210 and 220, in other embodiments any number of different gain circuits capable of providing different attenuation levels may be made available. In operation, one of the low-gain circuit 210 and the high-gain circuit 220 is selected by multiplexer 230 to be output to a squaring circuit as voltage signal $V_{O1}$.

Figure 2B:
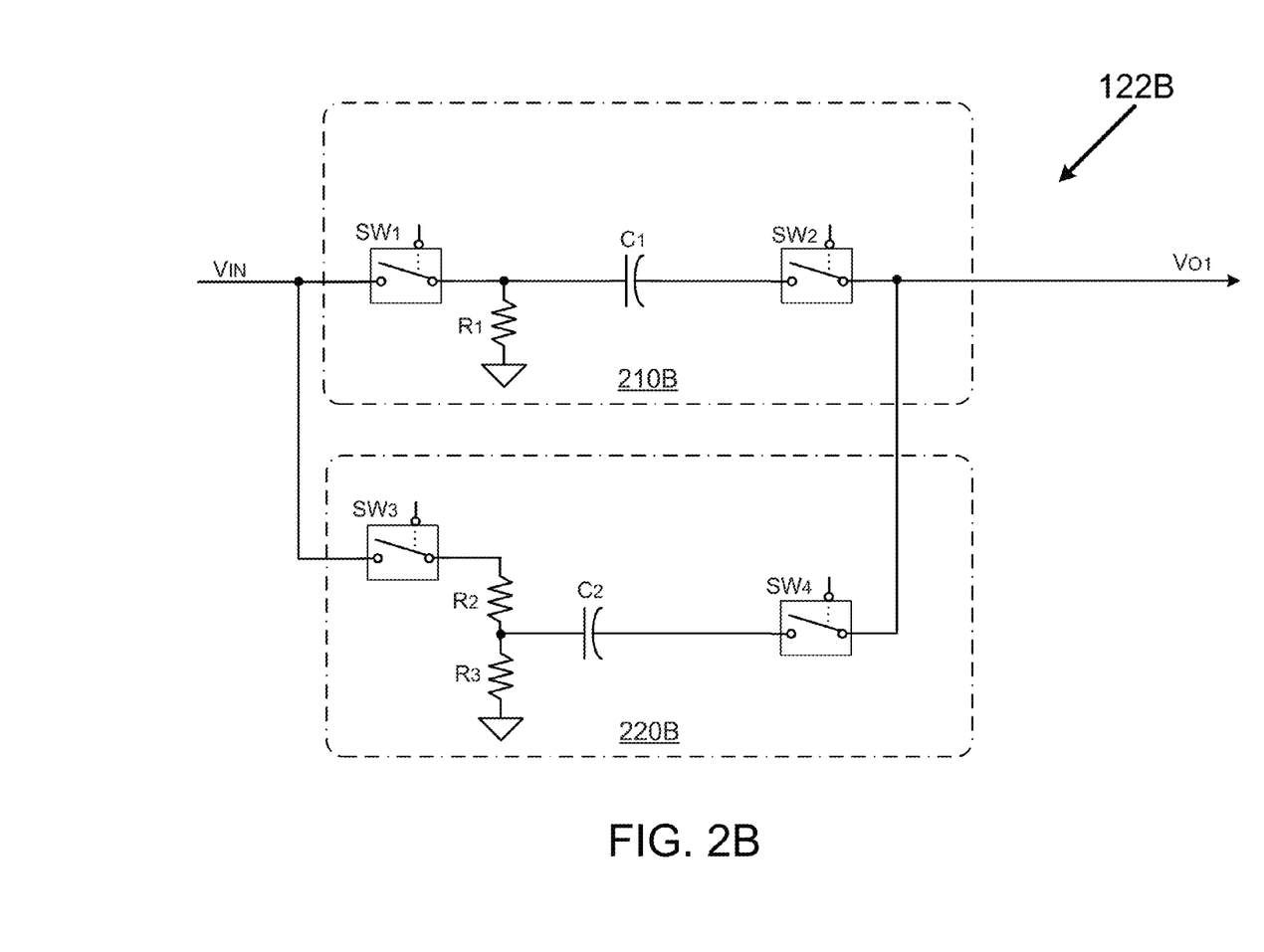
FIG. 2B is a realizable example of a scaling circuit usable for the detection circuit of FIG. 1.

FIG. 2B is a realizable example of an RF scaling circuit 122B usable for the detection circuit of FIG. 1. The scaling circuit 122B includes a low-gain (high-level input) circuit 210B, and a high-gain (low-level input) circuit 220B.

The low-gain circuit 210 includes a first switch SW1, a second switch SW2, a first resistor R1 and a first capacitor C1. The resistance of the first resistor R1 is set to fifty (50) ohms to accommodate standard receiver hardware, but in other embodiments the value of the first resistor R1 can vary as needed or otherwise found useful or acceptable. Switches SW1 and SW2 allow the low-gain circuit 210 to be enabled or disabled. Capacitor C1 is used to block DC signals.

The high-gain circuit 220 includes a third switch SW3, a fourth switch SW4, a second resistor R2, a third resistors R3 and a second capacitor C1. The resistance of resistors R2 and R3 are each twenty-five (25) ohms for a total series resistance of fifty ohms, but in other embodiments the value of resistors R2, R3 can vary. Switches SW3 and SW3 allow the high-gain circuit 220 to be enabled or disabled. As with capacitor C1, capacitor C2 is used to block DC signals.

Figure 3A:
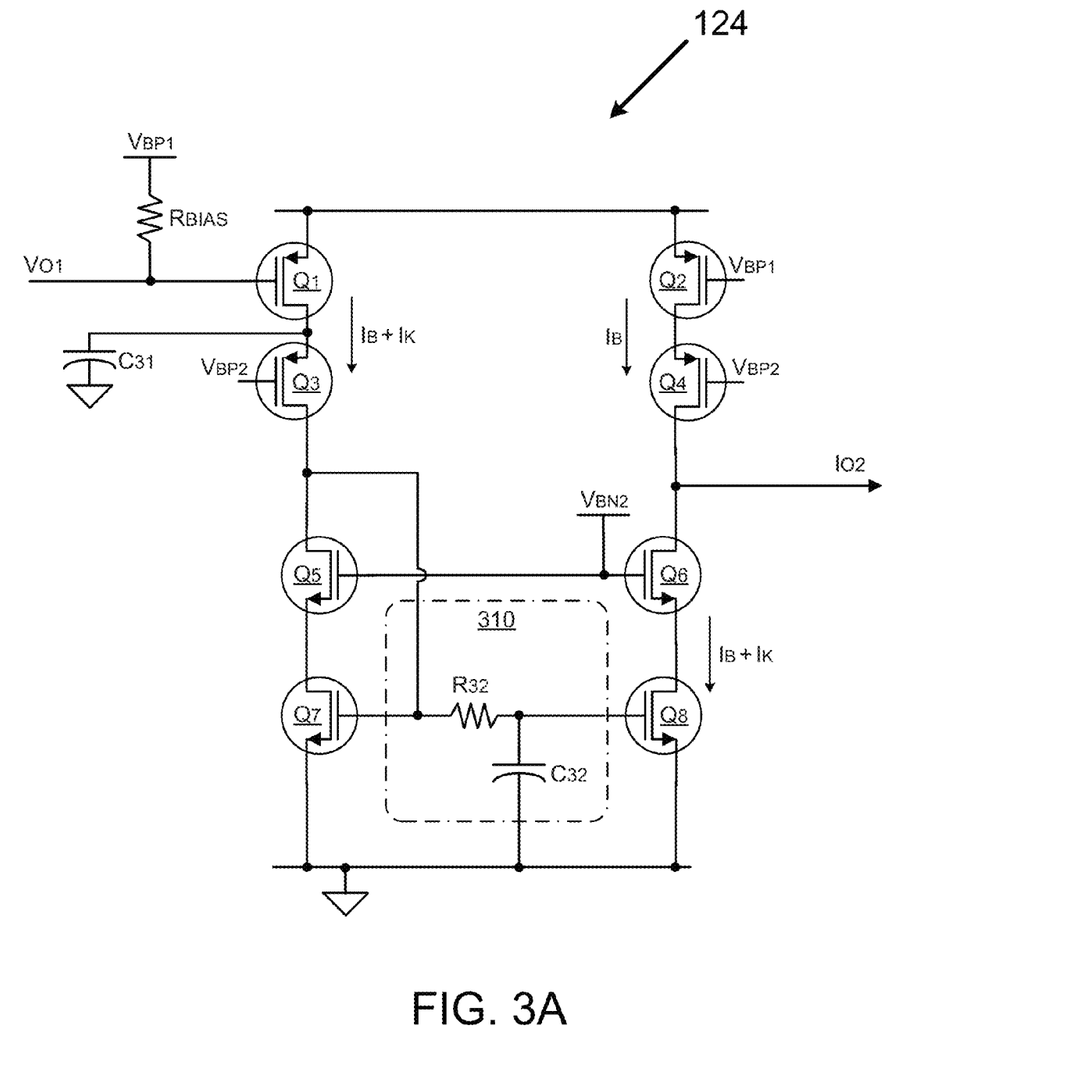
FIG. 3A is an example of a squaring circuit usable for the detection circuit of FIG. 1.

FIG. 3A is an example of the squaring circuit 124 usable for the detection circuit 120 of FIG. 1. The squaring circuit 124 includes an input bias resistor $R_{BIAS}$, a noise reduction capacitor $C_{31}$, Metal Oxide Semiconductor (MOS) transistors Q1-Q8, and a Low Pass Filter (LPF) 310.

While the example LPF 310 is shown as a single RC-filter of resistor $R_{32}$ and capacitor $C_{32}$, it is to be appreciated that the LPF can have multiple poles and that the bandwidth of LPF 310 can be made programmable. One reason for incorporating a programmable bandwidth is that different bandwidths will affect PAR accuracy and settling time. A smaller bandwidth provides greater PAR accuracy, but at the same time may hinder settling time to an unacceptable point, and so different bandwidths can provide strategically acceptable compromises. For the present example, the LPF can be programmed to four separate bandwidths to 10 KHz, 150 KHz, 300 KHz and 1 MHz, but the particular set of available bandwidths for a particular application may be expected to change from embodiment to embodiment.

In operation, transistors Q2 and Q4, which are biased by respective bias voltages $V_{BP1}$ and $V_{BP2}$, establish an operating bias current $I_B$ for the squaring circuit 124.

The application of input voltage $V_{O1}$ causes a current $I_B+I_k$ to pass through transistors Q1 and Q3. Current $I_k$ is proportional to the square of the input voltage and $=\mu n*k*V_{O1}^2$, where $\mu n*k$ are constants.

Current $I_k$ is mirrored in transistors Q6 and Q8, which in turn causes an output current $I_{O2}$ to be produced where current $I_{O2}=-I_k$. As mentioned above, because LPF 310 operates to lower PAR error, current $I_{O2}$ will be relatively smooth compared to $V_{O1}^2$. Thus, squaring circuit 124 is shown to receive an analog input signal, and process the analog input signal so as to produce a squared-output using the analog transfer functions of only analog components. While MOS transistors Q1-Q8 are used for the example of FIG. 3, it is possible that other components, such as jFET and bipolar transistors, may also be used so long as the end combination is capable of producing a square function based on the analog transfer function of the components.

Figure 3B:
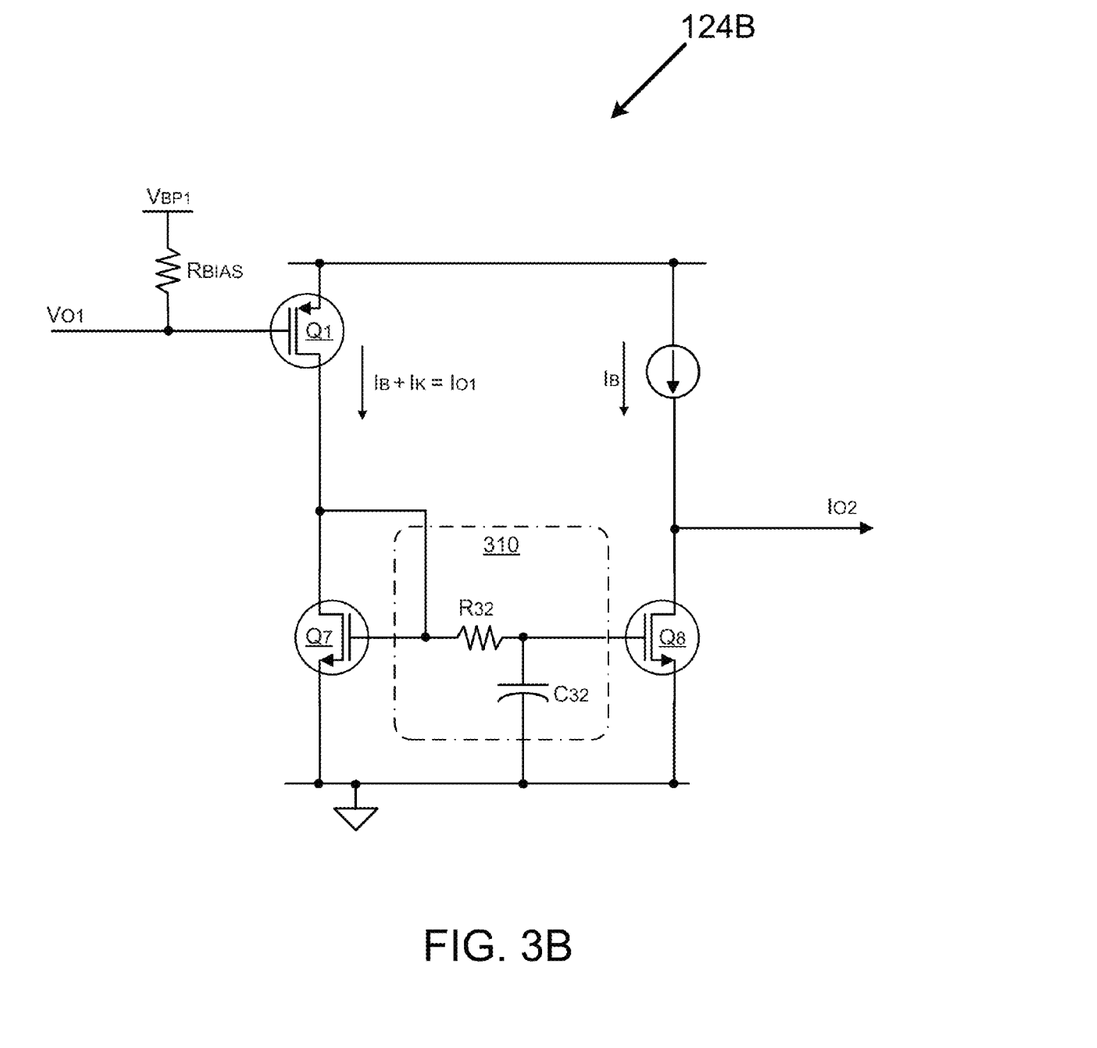
FIGS. 3B and 3C depict alternative example of the squaring circuit of FIG. 3A.
Figure 3C:
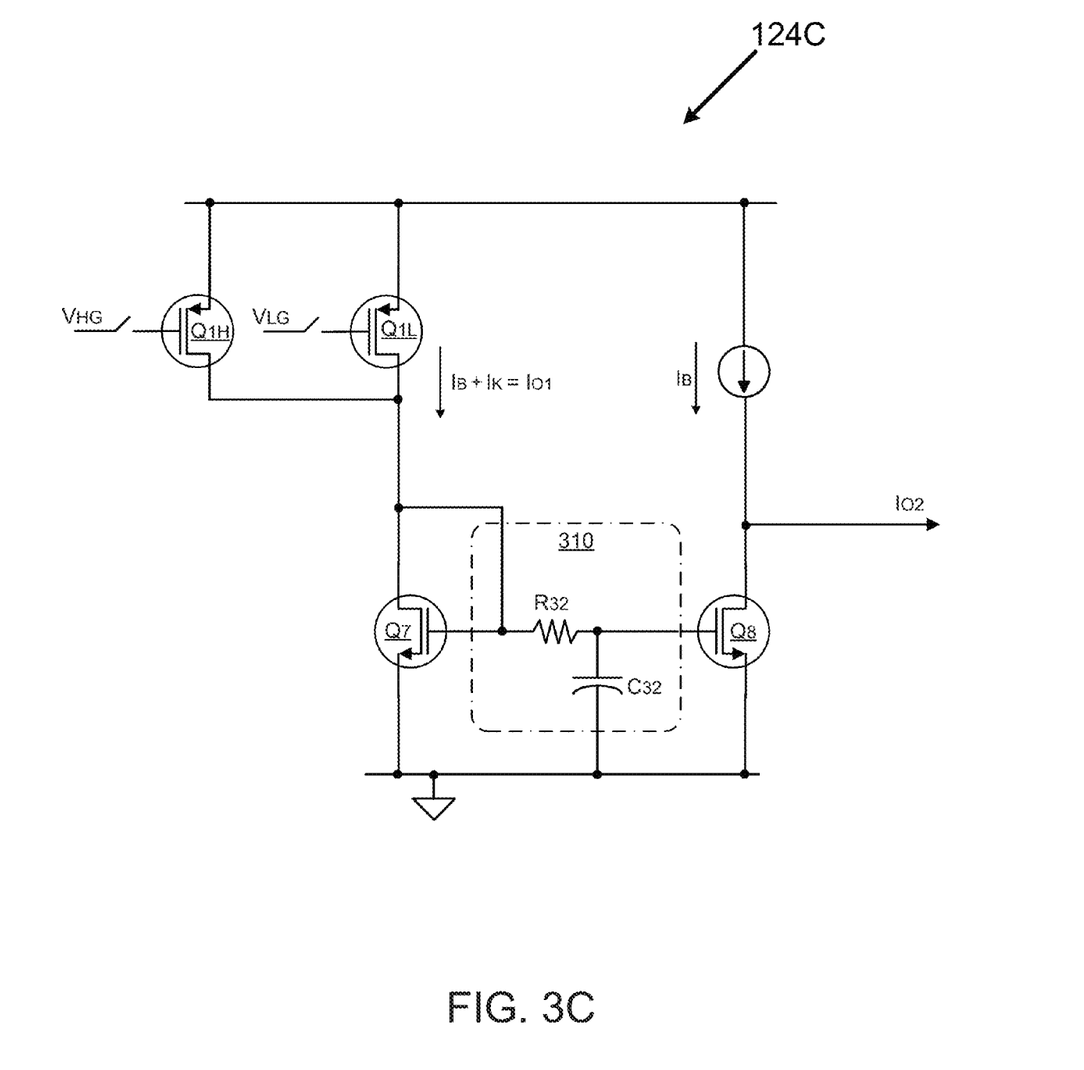

FIGS. 3B and 3C depict alternative example of the squaring circuit of FIG. 3. FIG. 3B demonstrates that a squaring circuit can be implemented with a lesser number of transistors than is shown in FIG. 3. FIG. 3C is a variant of FIG. 3B but having transistors $Q_{1L}$ and $Q_{1H}$ replace transistor $Q_1$ as part of a multiplexing scheme for the different scaling circuits of FIG. 2.

Figure 4A:
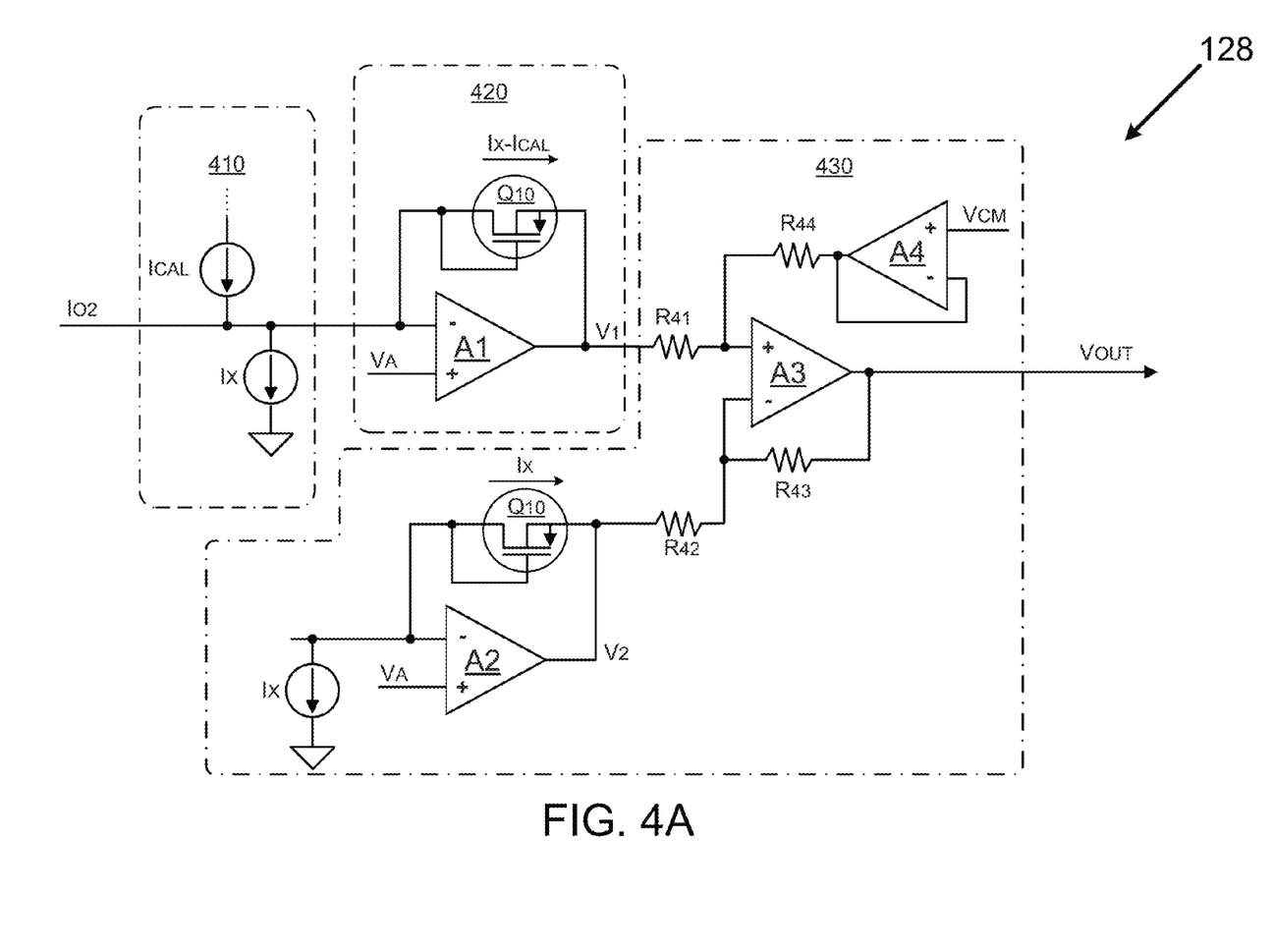
FIGS. 4A-4B depict an example of a square-root circuit usable for the detection circuit of FIG. 1.

FIG. 4A is an example of a square-root circuit 126 usable for the detection circuit 120 of FIG. 1. The square-root circuit 126 includes: (1) a first differential amplifier A1 having MOS transistor Q10 acting as an analog feedback component, a fixed bias current source $I_X$, and a variable/programmable current source $I_{CAL}$; (2) a second differential amplifier A2 having MOS transistor Q11 acting as an analog feedback component and a fixed bias current source $I_X$; and (3) a third differential amplifier A3 having transistors $R_{41}$, $R_{42}$, $R_{43}$ and $R_{44}$, and acting as a difference amplifier for voltages V1 and V2 produced respectively by amplifiers A1 and A2.

For purposes or later explanation, the various components of FIG. 4A are divided into components 410, 420 and 430.

Amplifier A4 provides a buffered common-mode voltage $V_{CM}$ to amplifier A3 via resistor $R_{44}$.

Reference voltage $V_A$ is provided to respective inputs to amplifiers A1 and A2. Reference voltage VA is produced by circuit 440 (see, FIG. 4B) that includes MOS transistors QA, QB, QC and QD. Transistors QA, QB act as a current mirror for the bias current $I_B$ of the squaring circuit of FIG. 3, while transistors QC, QD provide a resistive load.

In operation, each of amplifiers A1 and A2 are configured (via use of their respective feedback transistors {Q10, Q11}) to provide a square-root transfer function assuming that bias currents $I_X$ are properly set. By providing two separate amplifiers of identical configuration and bias, undesirable common-mode signals are reduced or eliminated by virtue of the difference circuit provided by amplifier A3. Accordingly, only the square-root of current $I_{O2}$ $(=-I_k)$ is theoretically processed as it is a differential component and not a common-mode component.

Figure 5:
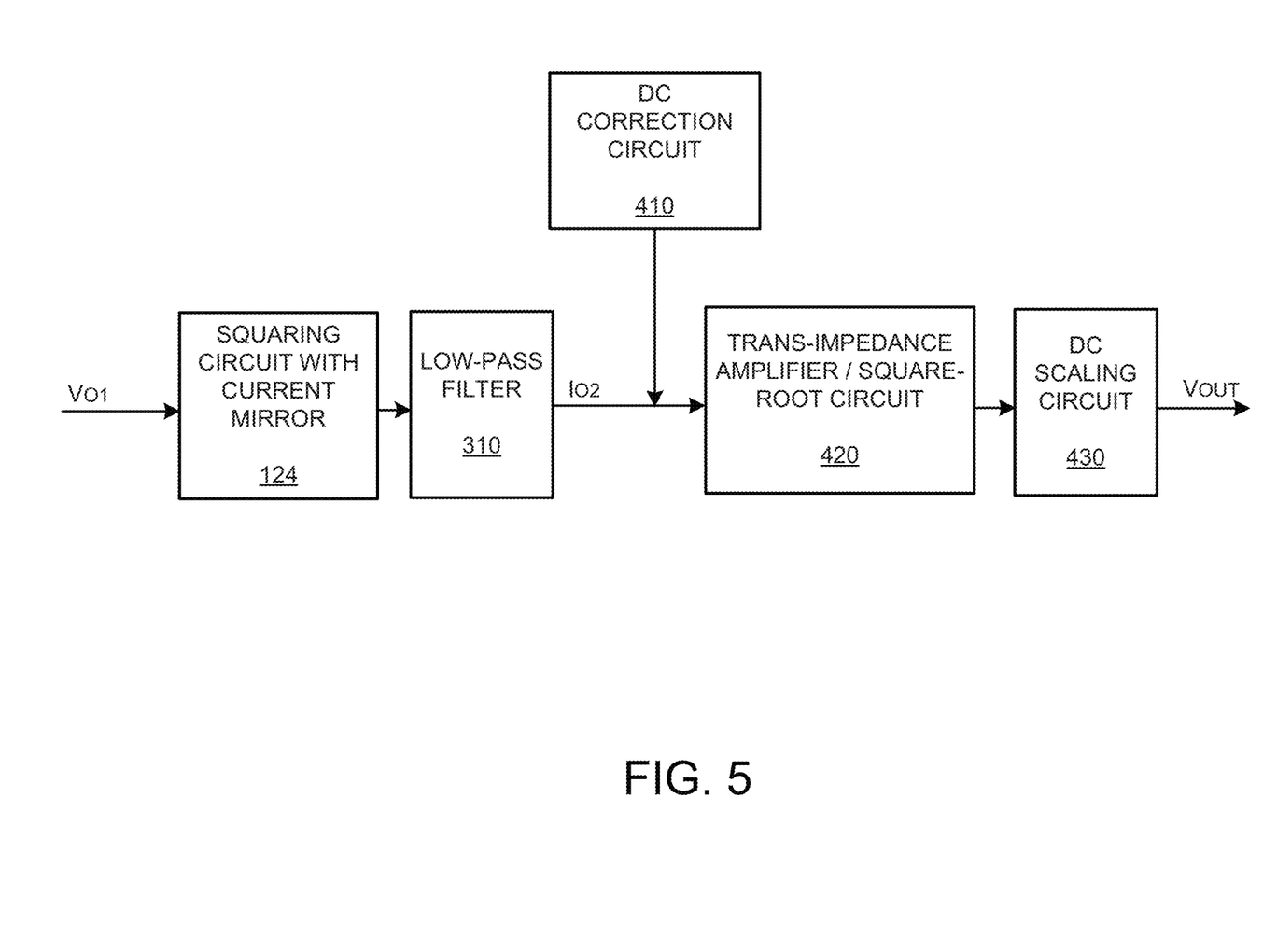
FIG. 5 represents an overall block diagram of the components of FIGS. 3-4B.

The programmable current source $I_{CAL}$ allows for the square-root circuit 225 to compensate for various offsets that are inherent in imperfect amplifiers and other components as will be further discussed with respect to FIG. 5.

As with the squaring circuit 124, the square-root circuit 225 is capable of processing an analog input signal so as to produce a square-root output using the analog transfer functions of only analog components.

Figure 4B:
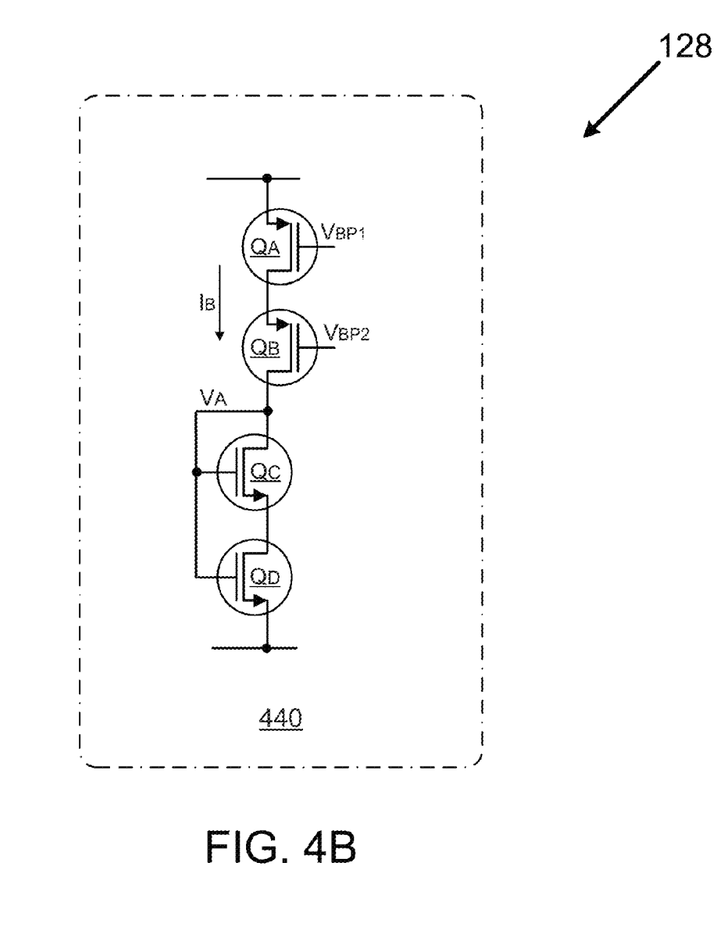

FIG. 5 represents an overall block diagram of the components of FIGS. 3-4B. As detailed explanations have been provided for the various components represented in FIG. 5, no further explanation is provided other than component 430 of FIG. 5 can provide the DC scaling functionality of the DC scaling circuit 128 of FIG. 1.

Figure 6:
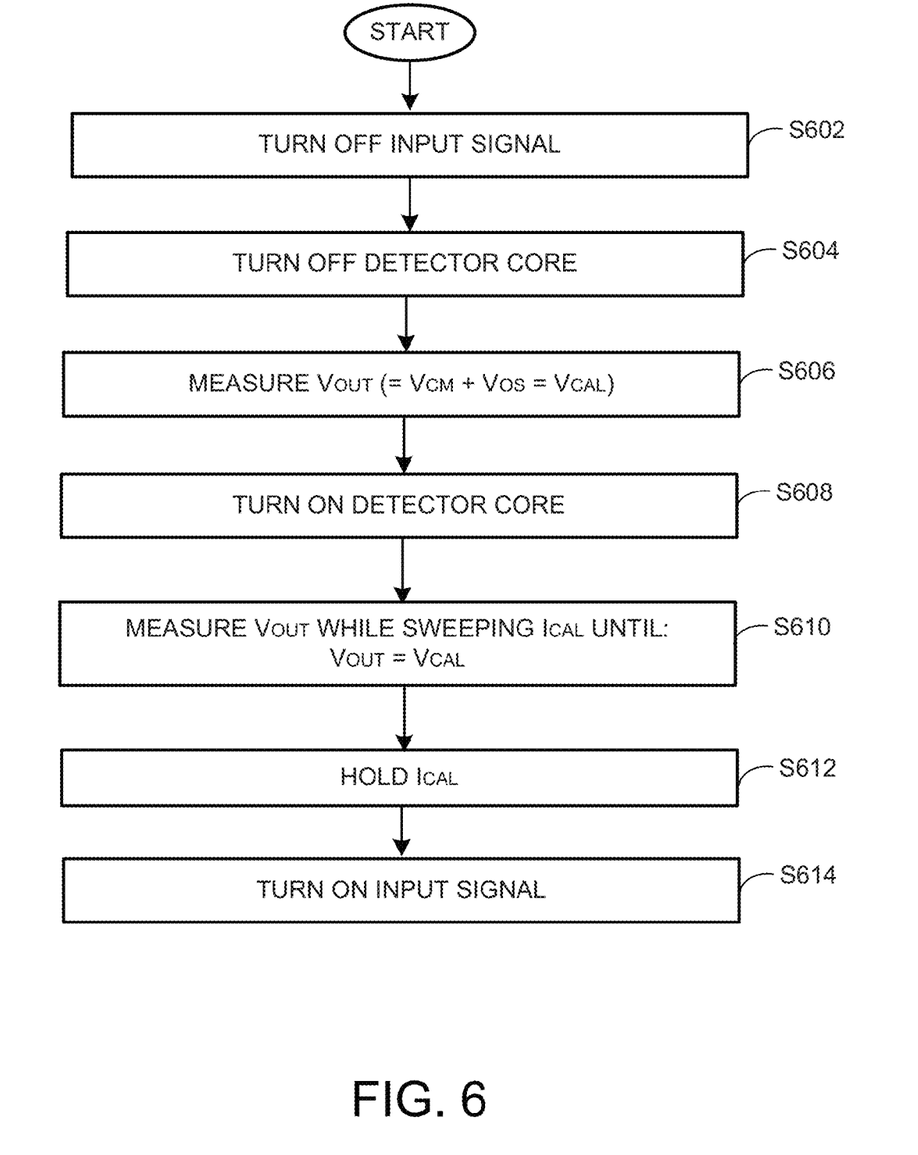
FIG. 6 is a flowchart outlining a set of example operations useful for calibrating the detection circuit of FIGS. 1-4B.

FIG. 6 is a flowchart outlining a set of example operations useful for calibrating the detection circuit 220 of FIGS. 1-5. It is to be appreciated to those skilled in the art in light of this disclosure that, while the various operations of FIG. 5 are shown according to a particular order for ease of explanation, that certain operations may be performed in different orders or in parallel.

The process starts at S602 where an analog input signal is turned off, which can be accomplished by opening switches SW2 and SW4 of FIG. 2. At S604, the detector core (by which is meant all components in FIG. 3, but not FIG. 4) is turned off. At S606 the output voltage $V_{OUT}$ of the amplifier of FIG. 4 is measured. The output voltage $V_{OUT}$ of the will equal the common-mode voltage ($V_{CM}$) plus the total offset voltages ($V_{OS}$) inherent in the amplifiers A1-A4 (and other devices), and will be designated as the calibration voltage $V_{CAL}$. Control continues to S508.

At S608, the detector core is turned on. At S610 the programmable current source $I_{CAL}$ is swept while voltage $V_{OUT}$ is measured until $V_{OUT}=V_{CAL}$. At S612 the programmable current source $I_{CAL}$ is held constant, and in S614 the input signal is turns on.

Figure 7:
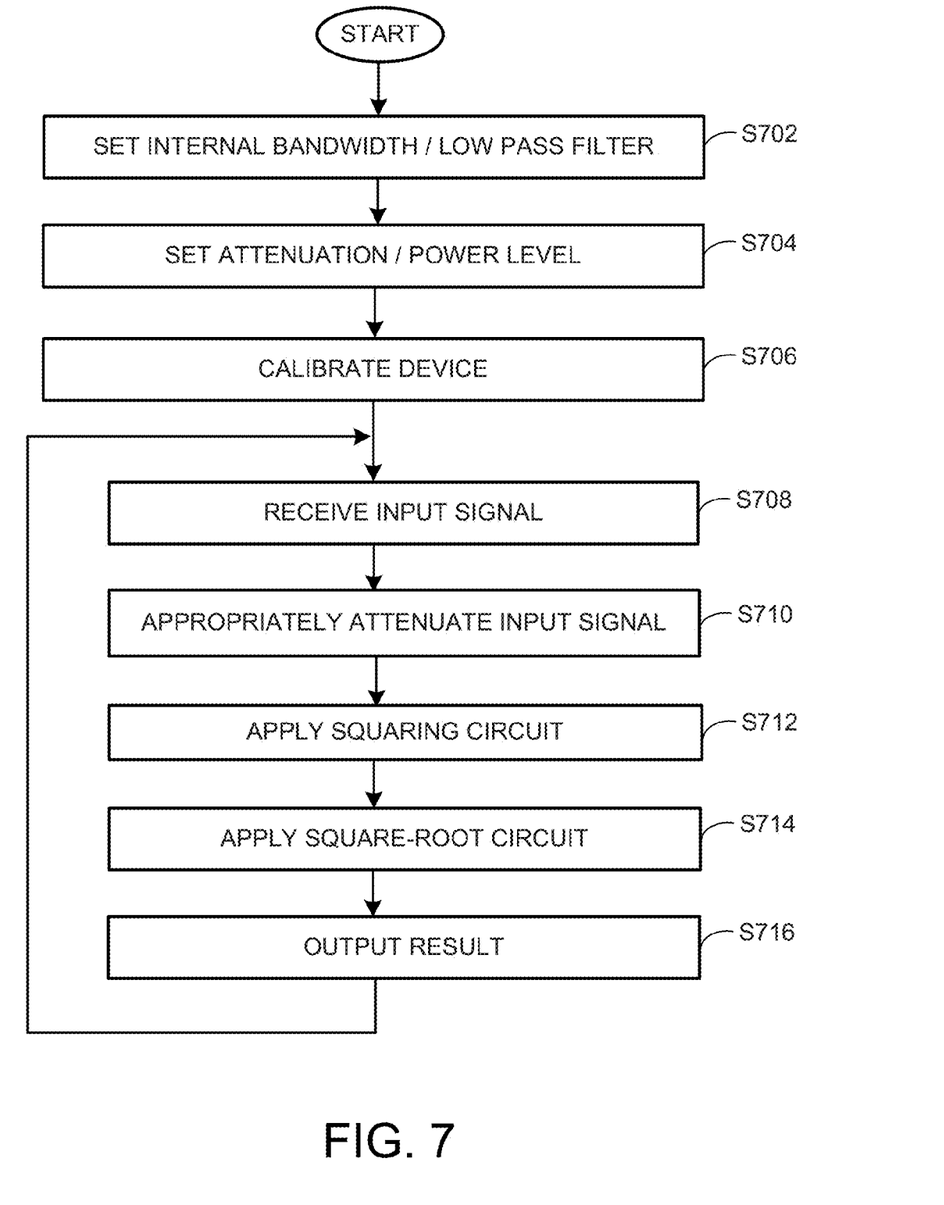
FIG. 7 is a flowchart outlining a set of example operations for operating the detection circuit of FIGS. 1-4B.

FIG. 7 is a flowchart outlining a set of example operations useful for a true RMS power detection of an analog signal. Again, it is to be appreciated to those skilled in the art in light of this disclosure that, while the various operations of FIG. 7 are shown according to a particular order for ease of explanation, that certain operations may be performed in different orders or in parallel.

The process starts at S702 where the an internal bandwidth, i.e., a LPF, is set for a squaring circuit, such as the squaring circuit 240 of FIG. 3. At S704, an attenuation/power level is set for an input scaling device, such as the scaling device 220 of FIG. 2. At S706 any number of calibration processes may be performed, including those calibration processes described above with respect to FIGS. 4-5. Control continues to S708.

At S708, an analog input signal is received, where after in S710 the analog input signal is optionally attenuated according to the setting made at S704. Control continues to S712.

At S712, an analog squaring process is performed on the analog input signal by an analog squaring circuit, such as that shown in FIG. 3, to produce a squared signal, and at S714 an analog square-root process is performed on the squared signal by an analog squaring circuit, such as that shown in FIG. 3. The resultant RMS power signal is then output at S716.

Figure 8:
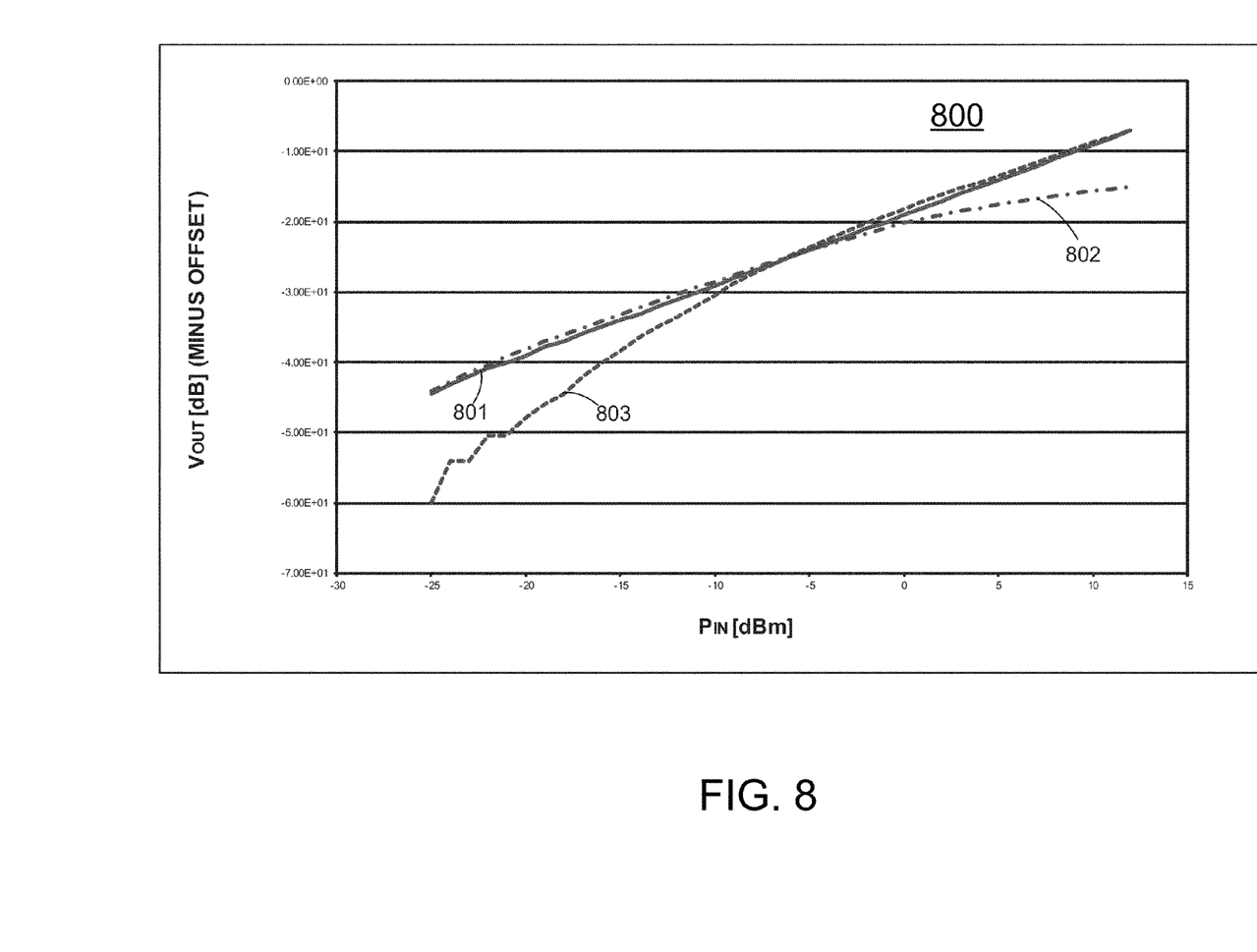
FIG. 8 depicts the performance of the detection circuit of FIGS. 1-4B in comparison to an idealized true RMS detector.

FIG. 8 depicts the simulated performance of the detection circuit of FIGS. 1-4 in comparison to an idealized true RMS detector. The idealized RMS curve is represented in line 801 while lines 802 and 803 represent RMS curves for the detection circuit of FIGS. 1-5 in a no attenuation mode (line 602) and in a 12 dB attenuation mode (line 803). Line 802 provides an accurate RMS detection except at the highest (see upper-right) power levels, while line 803 provides an accurate RMS detection except at the lowest (see lower-left) power levels. By strategically switching between high-power and low-power modes when input power (PIN) crosses about −8 dB, however, an RMS power detection may be realized that accurately tracks an ideal RMS detection over a range of −25 dB to +12 dB.

Figure 9:
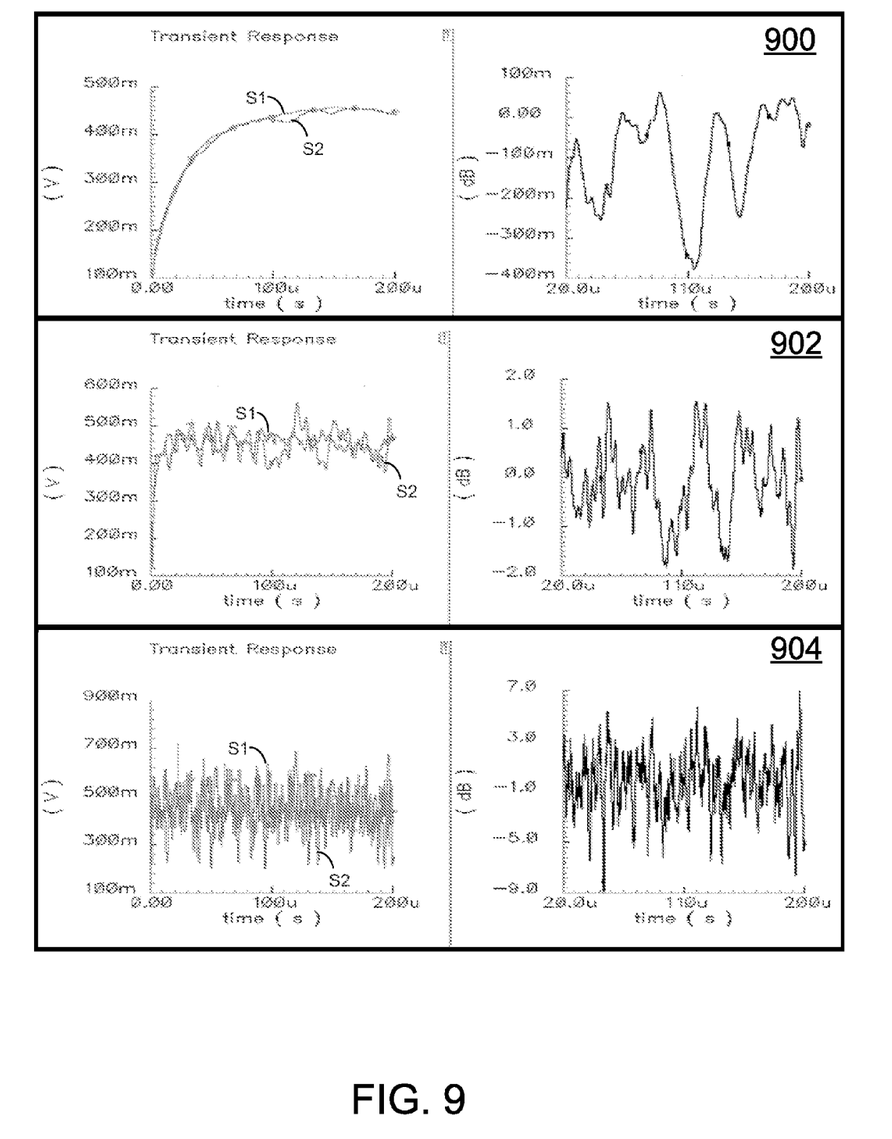
FIG. 9 depicts the performance of the detection circuit of FIGS. 1-4B under various simulations.

FIG. 9 depicts the performance of the detection circuit of FIGS. 1-4 under various simulations. Three charts, 900, 902 and 904 are provided representing three LPF/bandwidths for two separate signals {S1, S2}. S1 is a 4-slot QPSK signal; S2 is a 64 constellation QAM signal. Chart 900 represents a circuit response for a 10 KHz bandwidth filter; chart 902 represents a circuit response for a 100 KHz bandwidth filter; and chart 904 represents a circuit response for a 1 MHz bandwidth filter. As can be seen by these three examples, decreasing bandwidth decreases response time for both S1 and S2, but increases PAR accuracy. Similarly, increasing bandwidth increases response time but decreases PAR accuracy.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An electronic circuit capable of detecting a true Root-Mean-Square (RMS) power level of an analog input signal, comprising
a squaring circuit that receives the analog input signal and processes the analog input signal so as to produce a squared-output of the analog input signal using an analog transfer function of the squaring circuit; and
a square-root circuit that receives the squared-output and includes a first amplifier having an analog feedback component to produce a first voltage, a second amplifier having an analog feedback component to produce a second voltage, and a differential amplifier that produces the analog output based on the first voltage and the second voltage so as to produce an analog RMS output signal representing the true RMS power level of the analog input signal.

2. The electronic circuit of claim 1, wherein the squaring circuit includes one or more transistors that provide a squaring function using an analog squaring transfer function of its one or more transistors.

3. The electronic circuit of claim 2, wherein the squaring circuit includes one or more Metal Oxide Semiconductor (MOS) field-effect transistors.

4. The electronic circuit of claim 1, wherein the square-root circuit includes one or more transistors operable to provide a square-root function using an analog square-root transfer function of its one or more transistors.

5. The electronic circuit of claim 3, wherein the square-root circuit includes one or more MOS field-effect transistors.

6. The electronic circuit of claim 3, wherein both the squaring circuit and the square-root circuit perform their respective functions using only analog circuitry.

7. The electronic circuit of claim 6, wherein the squaring circuit includes an analog Low Pass Filter (LPF).

8. The electronic circuit of claim 7, wherein the Low Pass Filter (LPF) is configurable so as to provide a plurality of different filters of different bandwidths.

9. The electronic circuit of claim 8, further comprising:
a programmable scaling circuit that optionally attenuates the input signal before the input signal is provided to the squaring circuit.

10. The electronic circuit of claim 8, wherein the square-root circuit includes an amplifier using a field-effect transistor as an analog feedback component to produce a voltage.

11. The electronic circuit of claim 10, wherein:
the first amplifier of the square-root circuit uses a first field-effect transistor as the analog feedback component to produce the first voltage; and
the second amplifier of the square-root circuit uses a second field-effect transistor as the analog feedback component to produce the second voltage.

12. The electronic circuit of claim 11, wherein the first amplifier and the second amplifier produce their respective voltages based on a common reference voltage that is a function of a bias current of the squaring circuit.

13. The electronic circuit of claim 11, wherein the square-root circuit further includes a programmable current circuit electrically connected to an input of the first amplifier and capable of providing a compensation current that compensates for a DC offset of the electronic circuit.

14. An electronic circuit capable of detecting a true Root-Mean-Square (RMS) power level of an analog input signal, comprising
a squaring circuit that receives the analog input signal and processes the analog input signal so as to produce a squared-output of the analog input signal using an analog transfer function of the squaring circuit, wherein the squaring circuit includes one or more Metal Oxide Semiconductor (MOS) field-effect transistors operable in an analog range; and
a square-root circuit that receives the squared-output and includes a first amplifier having an analog feedback component to produce a first voltage, a second amplifier having an analog feedback component to produce a second voltage, and a differential amplifier that produces the analog output based on the first voltage and the second voltage so as to produce an analog RMS output signal representing the true RMS power level of the analog input signal, wherein the squaring circuit includes:
one or more Metal Oxide Semiconductor (MOS) field-effect transistors operable in an analog range, and
a programmable analog Low Pass Filter (LPF) configurable so as to provide a plurality of different filters;
wherein both the squaring circuit and the square-root circuit perform their respective functions using only analog circuitry.

15. The electronic circuit of claim 14, wherein:
the first amplifier of the square-root circuit uses a first field-effect transistor as the analog feedback component to produce the first voltage, and a programmable current circuit electrically connected to an input of the first amplifier and capable of providing a compensation current that compensates for a DC offsets produced by imperfections of the electronic circuit;
the second amplifier of the square-root circuit uses a second field-effect transistor as the analog feedback component to produce the second voltage, and
wherein the first amplifier and the second amplifier produce their respective voltages based on a common reference voltage that is a function of a bias current of the squaring circuit.

16. A method for detecting a true Root-Mean-Square (RMS) power from an input signal, comprising:
producing a square of the analog input signal so as to produce a squared-output of the analog input signal by applying an analog transfer function of an analog squaring circuit; and
producing a square-root circuit of the squared-output by applying an analog transfer function of an analog square-root circuit so as to produce an analog RMS output signal representing a true RMS power level of the analog input signal; and
providing a compensation current that compensates for a DC offset of the analog square-root circuit.

17. The method of claim 14, further comprising:
programmably attenuating the analog input signal before producing a square of the analog input signal.

18. The method of claim 14, further wherein producing a square of the analog input signal includes:
applying a Low Pass Filter (LPF) configured for a particular Peak-to-Average Ratio (PAR) of the input signal.

19. The method of claim 16, wherein the Low Pass Filter (LPF) is configurable so as to provide a plurality of different filters having different bandwidths.

* * * * *